United States Patent
Jain et al.

(10) Patent No.: US 10,957,787 B2
(45) Date of Patent: Mar. 23, 2021

(54) SENSORS BASED ON A HETEROJUNCTION BIPOLAR TRANSISTOR CONSTRUCTION

(71) Applicant: GLOBALFOUNDRIES Singapore Pte. Ltd., Singapore (SG)

(72) Inventors: Vibhor Jain, Essex Junction, VT (US); Joan Josep Giner de Haro, Singapore (SG); Qizhi Liu, Lexington, MA (US); You Qian, Singapore (SG); Humberto Campanella Pineda, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 71 days.

(21) Appl. No.: 16/299,860

(22) Filed: Mar. 12, 2019

(65) Prior Publication Data

US 2020/0295165 A1   Sep. 17, 2020

(51) Int. Cl.
| | |
|---|---|
| *H01L 29/165* | (2006.01) |
| *H01L 29/737* | (2006.01) |
| *H01L 29/66* | (2006.01) |
| *H01L 29/06* | (2006.01) |
| *H01L 23/528* | (2006.01) |

(Continued)

(52) U.S. Cl.
CPC .... *H01L 29/7371* (2013.01); *H01L 21/76802* (2013.01); *H01L 23/5283* (2013.01); *H01L 29/0649* (2013.01); *H01L 29/165* (2013.01); *H01L 29/66242* (2013.01); *G01N 27/4145* (2013.01)

(58) Field of Classification Search
None
See application file for complete search history.

(56) References Cited

U.S. PATENT DOCUMENTS

| | | |
|---|---|---|
| 5,801,442 A | 9/1998 | Hamilton et al. |
| 9,170,338 B2 | 10/2015 | Cai et al. |
| 9,515,198 B1 | 12/2016 | Ning et al. |

(Continued)

OTHER PUBLICATIONS

Zafar et al., "A comparison between bipolar transistor and nanowire field effect transistor biosensors", Appl. Phys. Lett. 106, 063701 (2015).

(Continued)

*Primary Examiner* — Joseph C. Nicely
*Assistant Examiner* — Lamont B Koo
(74) *Attorney, Agent, or Firm* — Thompson Hine LLP; Francois Pagette

(57) ABSTRACT

Transistor-based sensors and fabrication methods for a transistor-based sensor. A semiconductor layer is arranged over a substrate, and an interconnect structure is arranged over the semiconductor layer and the substrate. The semiconductor layer includes first sections composed of a semiconductor material, second sections composed of the semiconductor material, and cavities. The first sections have an alternating arrangement with the second sections in a lateral direction. The semiconductor material of the first sections is polycrystalline, and the semiconductor material of the second sections is single-crystal. First and second openings each extend in a vertical direction through the metallization levels of the interconnect structure to the semiconductor layer or through the substrate to the semiconductor layer. The first opening defines a first fluid inlet coupled to the cavities, and the second opening defines a first fluid outlet coupled to the cavities.

20 Claims, 12 Drawing Sheets

(51) Int. Cl.
    *H01L 21/768*    (2006.01)
    *G01N 27/414*    (2006.01)

(56) References Cited

U.S. PATENT DOCUMENTS

| | | |
|---|---|---|
| 9,625,409 B1 | 4/2017 | Cai et al. |
| 9,719,959 B2 | 8/2017 | Kang et al. |
| 2010/0187657 A1 | 7/2010 | Boeck et al. |
| 2012/0138460 A1 | 6/2012 | Baghbani-Parizi et al. |
| 2014/0141592 A1 | 5/2014 | Irsigler et al. |
| 2016/0153932 A1 | 6/2016 | Eklund et al. |
| 2016/0169834 A1 | 6/2016 | Ning et al. |
| 2017/0110492 A1 | 4/2017 | Gordon et al. |

OTHER PUBLICATIONS

Qizhi Liu et al., "Heterojunction Bipolar Transistors With Multiple Emitter Fingers and Undercut Extrinsic Base Regions" filed Jun. 20, 2018 as U.S. Appl. No. 16/013,363.
Taiwan Intellectual Property Office, Examination Report received in Taiwanese Patent Application No. 109104375 dated Jan. 6, 2021.

SENSORS BASED ON A HETEROJUNCTION BIPOLAR TRANSISTOR CONSTRUCTION

BACKGROUND

The invention relates generally to semiconductor device and integrated circuit fabrication and, in particular, to structures including transistor-based sensors and fabrication methods for a transistor-based sensor.

A bipolar junction transistor is a three-terminal electronic device that includes an emitter, a collector, and an intrinsic base arranged between the emitter and collector. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are composed of semiconductor materials with different energy bandgaps, which creates heterojunctions. For example, the collector and/or emitter of a heterojunction bipolar transistor may be composed of silicon, and the base of a heterojunction bipolar transistor may be composed of silicon germanium (SiGe), which is characterized by a narrower band gap than silicon.

Bipolar junction transistors may be used in sensing applications, such as biosensors. Transistor-based sensors rely on sensing charged ions or charged particles with a solution-receiving cavity that is incorporated into a modified back-end-of-line structure on a wafer. Modifications to the back-end-of-line structure to accommodate the cavity tend to be costly because a large sense area must be reserved in the back-end-of-line structure for the formation of the cavity. In addition, packaging from the front-side of the wafer is needed in order to receive solutions in the cavity.

Improved transistor-based sensors and fabrication methods for a transistor-based sensor are needed.

SUMMARY

In an embodiment of the invention, a structure for a sensor is provided. The structure includes a semiconductor layer over a substrate, and an interconnect structure over the semiconductor layer and the substrate. The semiconductor layer includes a first plurality of sections composed of a semiconductor material, a second plurality of sections composed of the semiconductor material, and a plurality of cavities. The first plurality of sections have an alternating arrangement with the second plurality of sections in a lateral direction. A first opening and a second opening each extend in a vertical direction through a plurality of metallization levels of the interconnect structure to the semiconductor layer or through the substrate to the semiconductor layer. The first opening defines a fluid inlet coupled to the cavities, and the second opening defines a fluid outlet coupled to the cavities. The semiconductor material of the first plurality of sections is polycrystalline, and the semiconductor material of the second plurality of sections is single-crystal.

In an embodiment of the invention, a method includes forming a semiconductor layer over a substrate, and forming an interconnect structure over the semiconductor layer and the substrate. The semiconductor layer includes a first plurality of sections comprised of a semiconductor material and a second plurality of sections comprised of the semiconductor material, and the first plurality of sections have an alternating arrangement with the second plurality of sections in a lateral direction. The method further includes forming a first opening and a second opening each extending in a vertical direction through a plurality of metallization levels of the interconnect structure or through the substrate to the semiconductor layer, and partially removing the first plurality of sections with an etching process to define a plurality of cavities in the semiconductor layer. The first opening defines a fluid inlet coupled to the plurality of cavities, and the second opening defines a fluid outlet coupled to the plurality of cavities. The semiconductor material of the first plurality of sections is polycrystalline, and the semiconductor material of the second plurality of sections is single-crystal.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
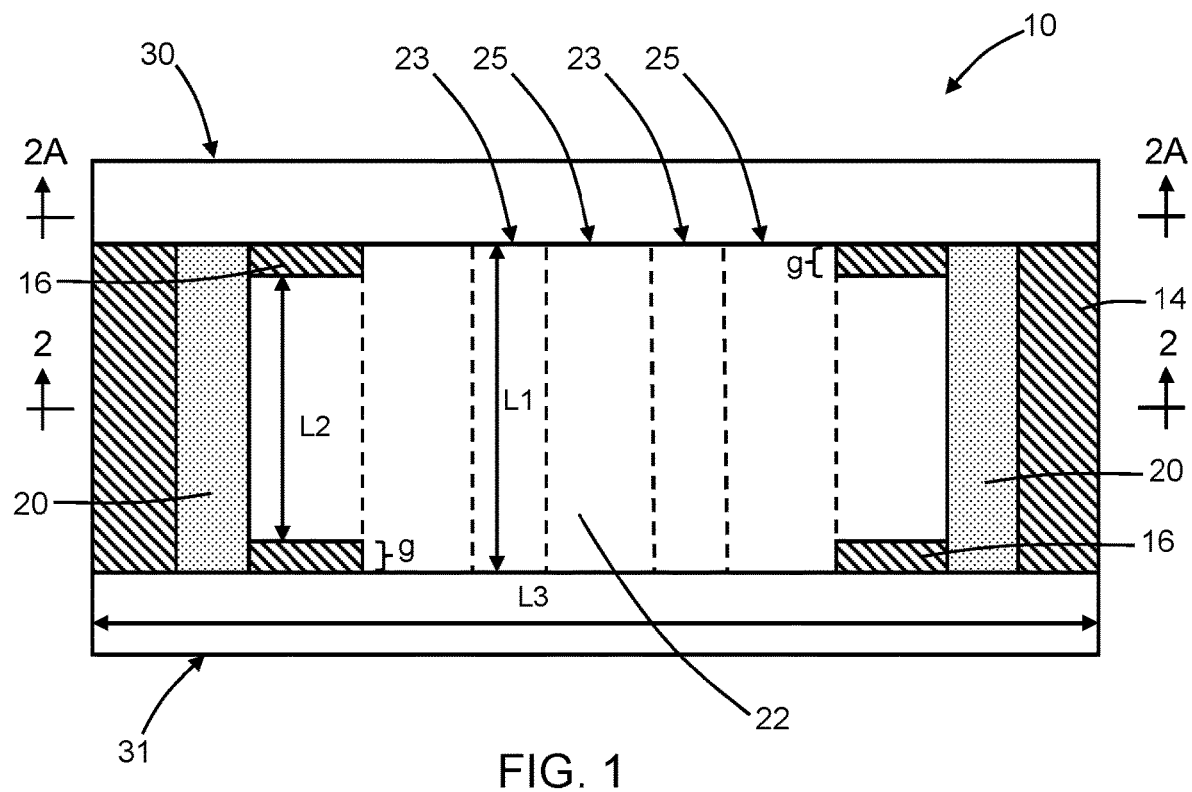
FIG. 1 is top view of a structure at an initial fabrication stage of a processing method in accordance with embodiments of the invention.
Figure 2:
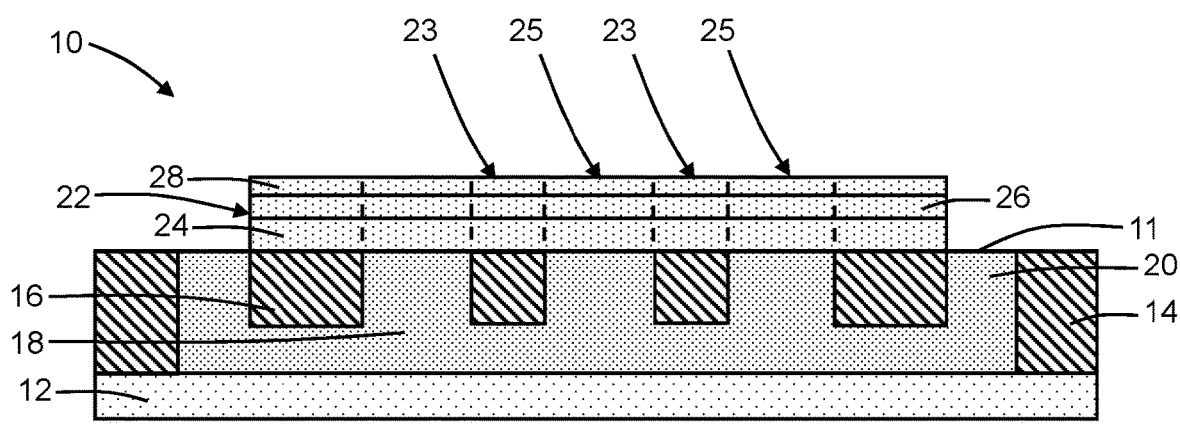
FIG. 2 is a cross-sectional view of the structure taken generally along line 2-2 in FIG. 1.
Figure 2A:
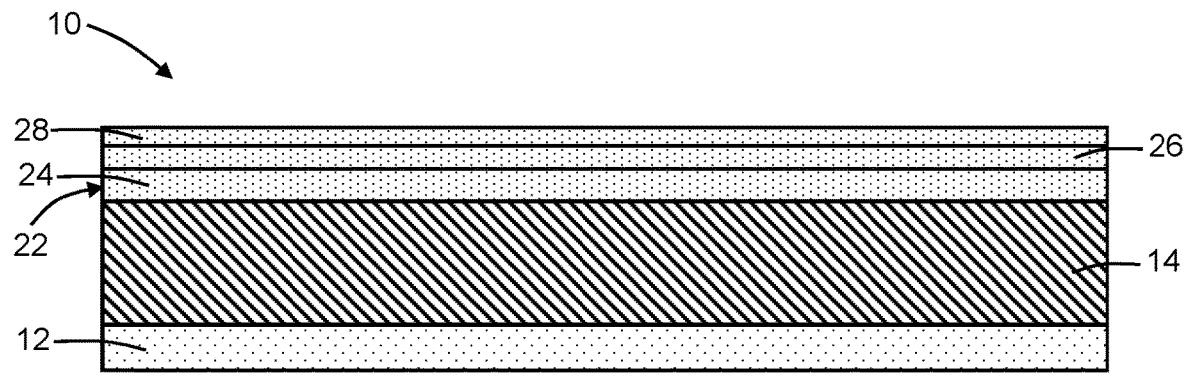
FIG. 2A is a cross-sectional view of the structure taken generally along line 2A-2A in FIG. 1.

With reference to FIGS. 1, 2, 2A and in accordance with embodiments of the invention, a structure 10 for a sensor is formed on a substrate 12. The substrate 12 may be composed of a single-crystal semiconductor material, such as single-crystal silicon. The single-crystal semiconductor material of the substrate 12 may be doped with a p-type dopant, such as boron. A trench isolation region 14 is formed in the substrate 12 and is arranged to surround an active region 18 of the substrate 12. Additional trench isolation regions 16 are arranged inside the active region 18 and extend to a shallower depth in the substrate 12 than the trench isolation region 14. The trench isolation region 14 and the trench isolation regions 16 may be formed by a shallow trench isolation (STI) technique that relies on lithography and etching processes to form a pattern of trenches in the substrate 12, followed by depositing a dielectric material in the trenches, planarizing with chemical mechanical polishing (CMP), and recessing with a de-glaze process. The dielectric material may be composed of silicon dioxide deposited by chemical vapor deposition (CVD).

The active region 18 has a polarity or conductivity type that is opposite to the polarity or conductivity type of the substrate 12. The active region 18 may be doped by, for example, ion implantation of an n-type dopant, such as phosphorus, arsenic, and/or antimony, before the trench isolation regions 14, 16 are formed. The active region 18 may extend laterally to contact regions 20 that are arranged in the substrate 12 between the trench isolation region 14 and the outermost trench isolation regions 16.

A semiconductor layer 22 is formed over the active region 18 and the trench isolation regions 14, 16. The semiconductor layer 22 includes sections 23 that contain polycrystalline semiconductor material characterized by grains and grain boundaries. The sections 23 are arranged over the trench isolation regions 16. The extension regions 30, 31 contain the same polycrystalline semiconductor material as the sections 23 and are arranged over the trench isolation region 14. The semiconductor layer 22 includes sections 25 that contain single-crystal semiconductor material. The sections 25 are arranged over the active region 18 and between the sections 23 over the trench isolation regions 16. The semiconductor material in the polycrystalline sections 23 of the semiconductor layer 22 and the extension regions 30, 31 of the semiconductor layer 22 have the same composition as the semiconductor material in the single-crystal sections 25 of the semiconductor layer 22.

The semiconductor layer 22 may be formed using a low temperature epitaxial growth process that is non-selective, such as rapid thermal chemical vapor deposition (RTCVD). Single-crystal semiconductor material (e.g., single-crystal silicon or single-crystal silicon-germanium) epitaxially grows over the sections of the active region 18 and polycrystalline semiconductor material forms over the trench isolation regions 14, 16. The crystal structure of the single-crystal semiconductor material of the active region 18 serves as a crystalline template for the growth of the single-crystal semiconductor material of the semiconductor layer 22 as the composition is modulated during growth. In contrast, the trench isolation regions 14, 16 do not provide any type of crystalline template resulting in the formation of the polycrystalline semiconductor material. In an embodiment, the semiconductor layer 22 may be doped with a concentration of a p-type dopant (e.g., boron and/or indium) to provide p-type conductivity and may be in-situ doped during epitaxial growth.

The polycrystalline sections 23 and the single-crystal sections 25 of the semiconductor layer 22 transition at respective interfaces, as diagrammatically shown by the dashed lines in FIG. 2. Although the interfaces are shown as vertically oriented, the interfaces may be inclined at an angle that is less than 90° or greater than 90°, and may include irregularities. The interfaces may be arranged directly over respective interfaces between the trench isolation regions 16 and the active region 18. The thickness of the polycrystalline sections 23 of the semiconductor layer 22 and the thickness of the single-crystal sections 25 of the semiconductor layer 22 may be equal. Alternatively, these thicknesses may differ from each other due to, for example, differences in growth and/or deposition rates.

The semiconductor layer 22 is patterned with lithography and etching processes to expose the contact regions 20 and to define the shapes of the sections 23, 25 and the shapes of the extension regions 30, 31. The extension regions 30, 31 extend laterally beyond the side edges of the sections 23, 25 of the semiconductor layer 22. During patterning, the outermost sections 23 of the semiconductor layer 22 are shortened, which generates gaps, g, that disconnect these shortened peripheral sections 23 from the extension regions 30, 31. Portions of the trench isolation regions 16 are exposed in these gaps by the partial removal of the outermost sections 23 of the semiconductor layer 22. Otherwise, the sections 23 of the semiconductor layer 22 define parallel strips that intersect and are continuous with each of the extension regions 30, 31 and that are laterally arranged in a lengthwise direction between the different extension regions 30, 31. The sections 23 and the sections 25 of the base layer have a length, L1, the outermost sections 23 have a length, L2, that is less than the length, L1, and the extension regions 30, 31 have a length, L3, in a direction that is transverse to the lengths of the sections 23, 25.

In an embodiment, the semiconductor layer 22 may include a layer stack with individual sublayers 24, 26, 28 in which the sublayer 26 arranged in a vertical direction between the sublayer 24 and the sublayer 28. The sublayers 24, 26, 28 of the semiconductor layer 22 include individual polycrystalline sections that collectively constitute the sections 23 of polycrystalline semiconductor material, and individual single-crystal sections that collectively constitute the sections 25 of semiconductor material. The single-crystal sections of the sublayer 24 may be in direct contact with the active region 18 and the polycrystalline sections of the sublayer 24 may be in direct contact with the trench isolation regions 14, 16.

The single-crystal and polycrystalline sections of the sublayer 24 may have the same composition. In an embodiment, the single-crystal and polycrystalline sections of the sublayer 24 may be composed of semiconductor material that lacks germanium and, in an embodiment, may be composed entirely of silicon. The single-crystal and polycrystalline sections of the sublayer 26 may have the same composition. In an embodiment, the single-crystal and polycrystalline sections of the sublayer 26 may be composed of a semiconductor material, such as silicon-germanium (SiGe) including silicon and germanium combined in an alloy with the silicon content ranging from 95 atomic percent to 50 atomic percent and the germanium content ranging from 5 atomic percent to 50 atomic percent. The single-crystal and polycrystalline sections of the sublayer 28 may have the same composition. In an embodiment, the single-crystal and polycrystalline sections of the sublayer 28 may be composed of semiconductor material that lacks germanium and, in an embodiment, may be composed entirely of silicon. In an alternative embodiment, the sublayer 28 may have a germanium content (e.g., 1 atomic percent) that is significantly less than the germanium content of the sublayer 24. During epitaxial growth, the composition of the semiconductor layer 22 may be modulated by exerting control over the deposition conditions to provide the sublayers 24, 26, 28 of different composition.

Figure 3:
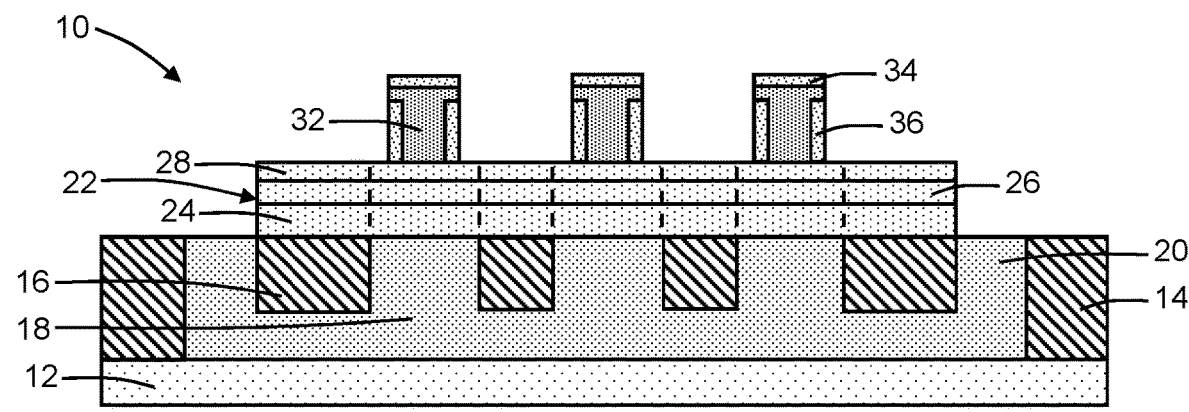
FIG. 3 is a cross-sectional view of the structure at a fabrication stage subsequent to FIG. 2.
Figure 3A:
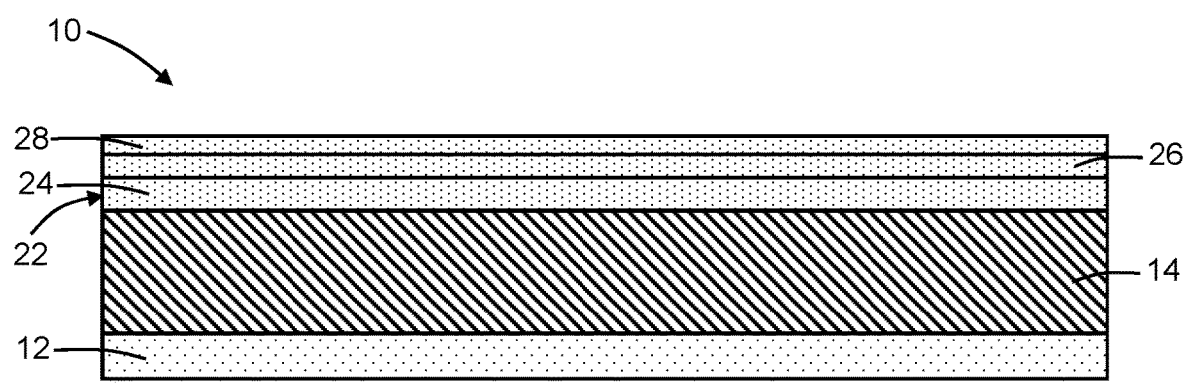
FIG. 3A is a cross-sectional view of the structure at a fabrication stage subsequent to FIG. 2A.

With reference to FIGS. 3, 3A in which like reference numerals refer to like features in FIGS. 2, 2A and at a subsequent fabrication stage of the processing method, fingers 32 and associated caps 34 are formed over the semiconductor layer 22 in emitter windows defined in one or more dielectric layers 36. The fingers 32 are arranged over the single-crystal sections 25 of the semiconductor layer 22 and between adjacent polycrystalline sections 23 of the semiconductor layer 22. The fingers 32 may have a substantially parallel arrangement and may extend in an orthogonal direction relative to the length of the extension regions 30, 31. In an embodiment, the fingers 32 may be in direct contact with the single-crystal semiconductor material in the sublayer 28 of the semiconductor layer 22.

The fingers 32 and caps 34 may be formed by depositing a highly-doped semiconductor layer that fills windows defined in one or more previously-deposited dielectric layers 36, depositing a cap layer on the deposited semiconductor layer, forming an etch mask that covers these deposited layers over the windows, and etching with reactive ion etching to sequentially pattern the caps 34 and then the fingers 32 with the caps 34 acting as a hardmask. The fingers 32 may contain a polycrystalline semiconductor material, such as polycrystalline silicon, deposited by chemical vapor deposition, and may be heavily doped during deposition with a concentration of an n-type dopant (e.g., phosphorus and/or arsenic) to provide n-type conductivity. The caps 34 may be composed of a dielectric material, such as silicon nitride. The number of fingers 32 may be equal to the number of sections 23 of single-crystal semiconductor material, and the number of fingers 32 and sections 23 may vary depending on the design of the structure 10.

After forming the fingers 32 and performing a self-aligned etch that removes unmasked portions of the one or more dielectric layers 36, the polycrystalline semiconductor material in the upper pair of sublayers 26, 28 in the sections 23 of the semiconductor layer 22 may be implanted with ions. The ion implantation may deliver a p-type dopant (e.g., boron and/or indium) under given implantation conditions (e.g., ion species, dose, kinetic energy, implantation angle). The implantation of the polycrystalline semiconductor material in the upper pair of sublayers 26, 28 of the semiconductor layer 22 with an electrically-active dopant may provide the structure with a lowered resistance that can be used in subsequent fabrication stages for forming contacts.

Figure 3B:
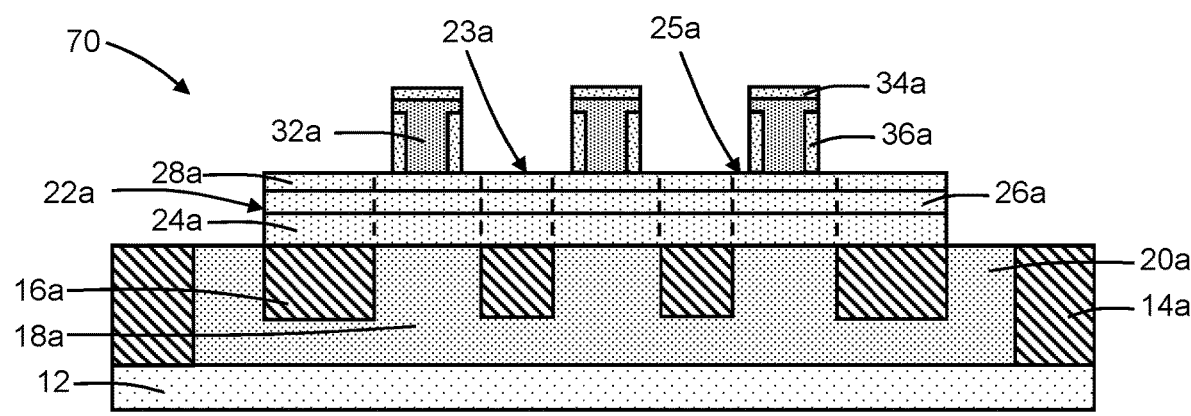
FIG. 3B is a cross-sectional view similar to FIG. 3 of a structure for a heterojunction bipolar transistor that may be fabricated in parallel with the structure of FIG. 3.

As shown in FIG. 3B, a heterojunction bipolar transistor 70 may be fabricated in parallel with the fabrication of the structure 10 and may be formed in a different region of the substrate 12. The heterojunction bipolar transistor 70 and the structure 10 may have identical constructions at this juncture of their concurrent fabrication. The heterojunction bipolar transistor 70 may include a base layer 22a that may be formed and patterned concurrently with the semiconductor layer 22. The base layer 22a may include single-crystal sections 25a analogous to sections 25 that provide sections of an intrinsic base and polycrystalline sections 23a analogous to sections 23 that provide sections of an extrinsic base. The heterojunction bipolar transistor 70 may include multiple emitter fingers 32a that are formed concurrently with the fingers 32 of the structure 10. The heterojunction bipolar transistor 70 may include a collector 18a and collector contact regions 20a that may be concurrently formed with the active region 18 and contact regions 20. The collector 18a and collector contact regions 20a may have shapes defined by a trench isolation region 14a that may be concurrently formed with the trench isolation region 14 and trench isolation regions 16a that may be concurrently formed with the trench isolation regions 16.

The heterojunction bipolar transistor 70 may be used, for example, to form a power amplifier and/or a low-noise amplifier that is located on the same chip as the structure 10 providing a sensor. The integration provides a monolithic structure in that the structure 10 that is further processed to form a sensor, as subsequently described, and the heterojunction bipolar transistor 70 are arranged on the same chip. The chip may also integrate other components, such as switches, filters, duplexers, analog-to-digital controllers, digital-to-analog controllers, a microcontroller, etc.

Figure 4:
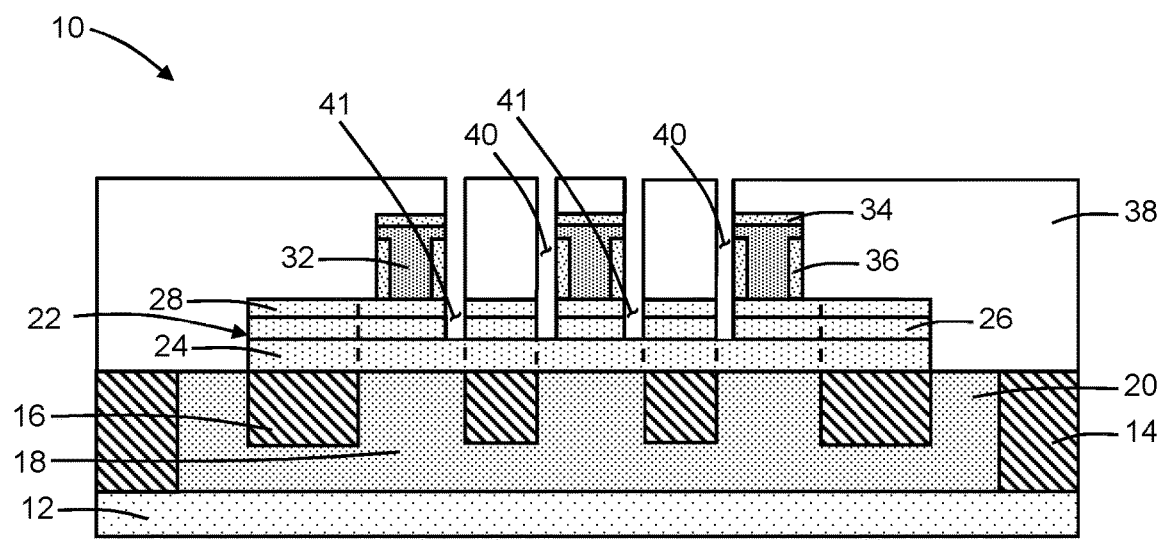
FIGS. 4-7 and 4A-7A are respective cross-sectional views of the structure of FIGS. 3, 3A at successive fabrication stages.
Figure 4A:
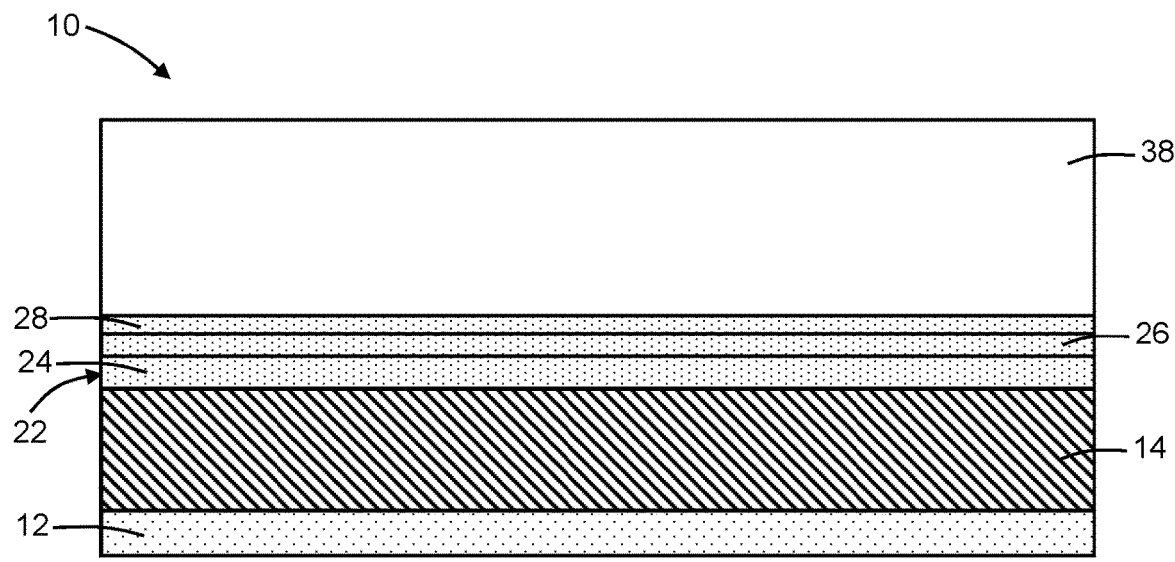

With reference to FIGS. 4, 4A in which like reference numerals refer to like features in FIGS. 3, 3A and at a subsequent fabrication stage of the processing method, an etch mask 38 is applied and patterned by lithography to define a plurality of openings 40 that expose areas of the upper sublayer 28 of the semiconductor layer 22 in sections 23. Although the openings 40 in the etch mask 38 may be self-aligned to the caps 34 as shown, the openings 40 may be respectively spaced at a distance from the caps 34 defined by the photolithography tolerances. An etching process, such as reactive ion etching, is used to remove the upper pair of sublayers 26, 28 of the semiconductor layer 22 over the areas exposed by the openings 40 to define slots or notches 41 that extend through respective portions of the polycrystalline semiconductor material in the sublayers 26, 28 to the polycrystalline semiconductor material in the sections of sublayer 24 of the semiconductor layer 22. In an alternative embodiment, the notches 41 may be etched partially through the sublayer 24. The openings 40, which are subsequently filled by dielectric material, operate to eventually isolate the polycrystalline semiconductor material in sublayers 26, 28 from the single-crystal semiconductor material in sublayers 26, 28. The extension regions 30, 31 are masked by the etch mask 38 during the etching process.

Figure 5:
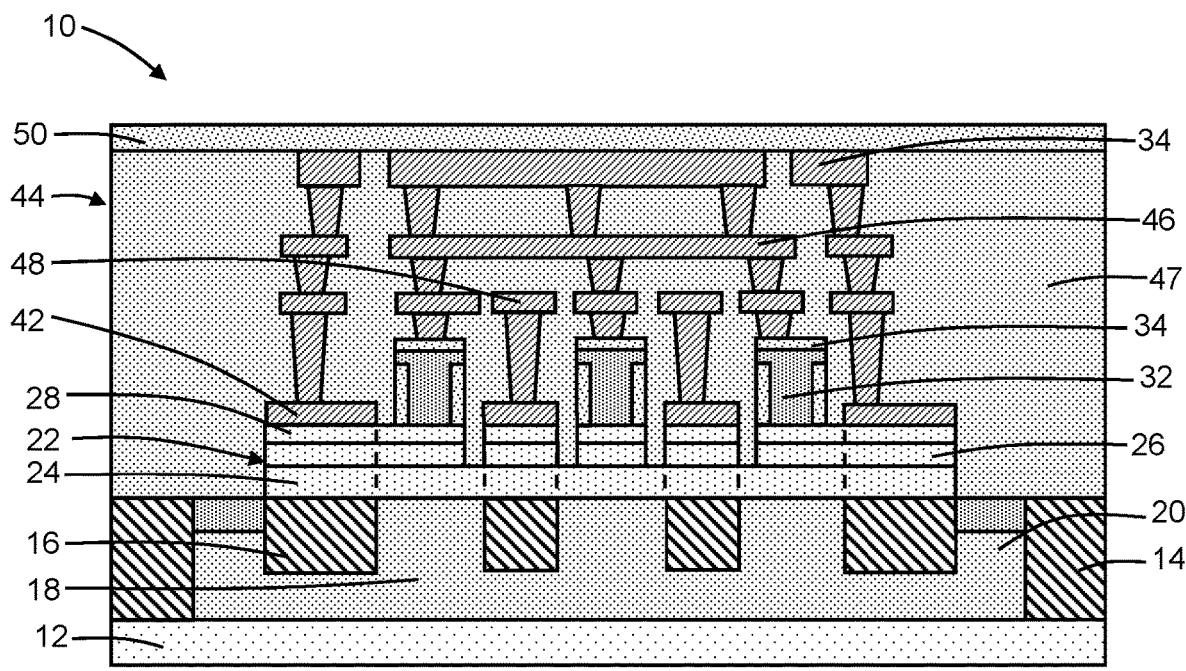
Figure 5A:
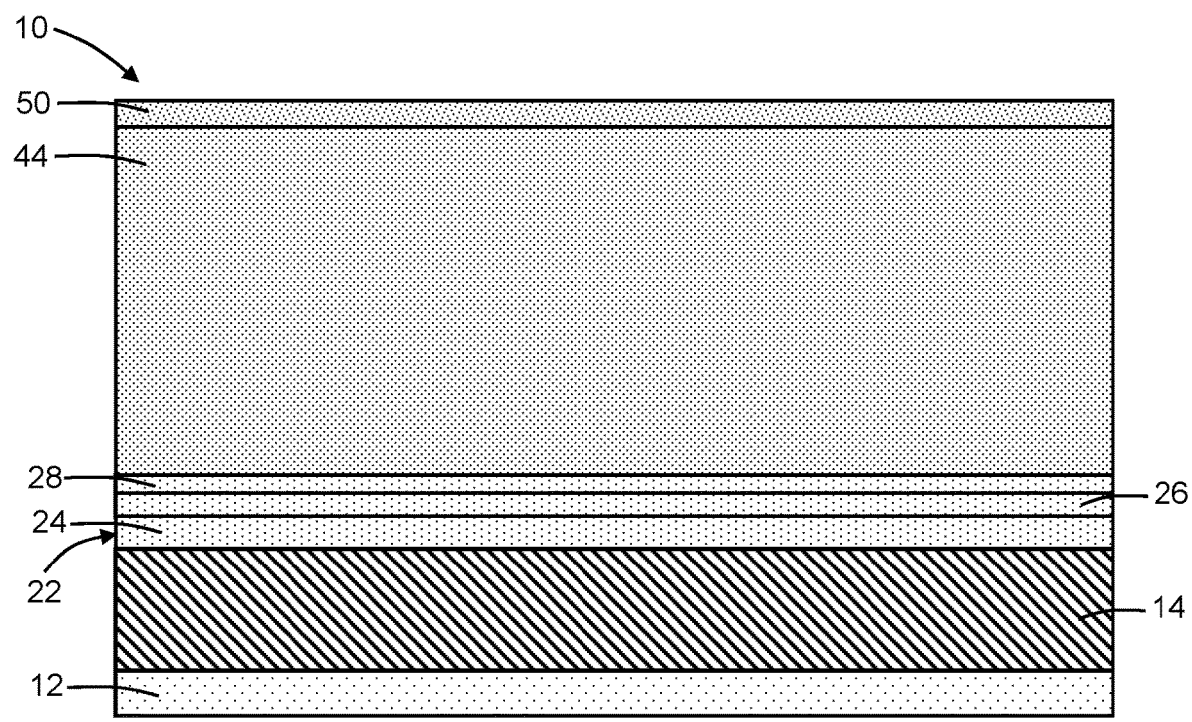

With reference to FIGS. 5, 5A in which like reference numerals refer to like features in FIGS. 4, 4A and at a subsequent fabrication stage of the processing method, middle-of-line (MOL) processing and back-end-of-line (BEOL) processing follow, which includes formation of contacts, vias, and wiring for an interconnect structure coupled with the structure 10. As part of this processing, contacts 42 including a silicide layer may be formed on the sections of the polycrystalline semiconductor material of the semiconductor layer 22, and metallization levels 44 may be formed in a stack over the structure 10 and substrate 12. The metallization levels 44 may include one or more dielectric layers 47, metallization features 46 in the one or more dielectric layers that are coupled with the fingers 32, metallization features 49 in the one or more dielectric layers that are coupled with one or both of the contact regions 20, and metallization features 48 in the one or more dielectric layers 47 that are coupled with the polycrystalline semiconductor material in the upper sublayer 28 of the semiconductor layer 22 in the sections 23 (FIGS. 1, 2). A cap layer 50 composed of a dielectric material, such as silicon nitride, may be arranged at the top of the interconnect structure. In an embodiment, the metallization levels 44 may also include metallization that is arranged over the extension regions 30, 31.

Figure 6:
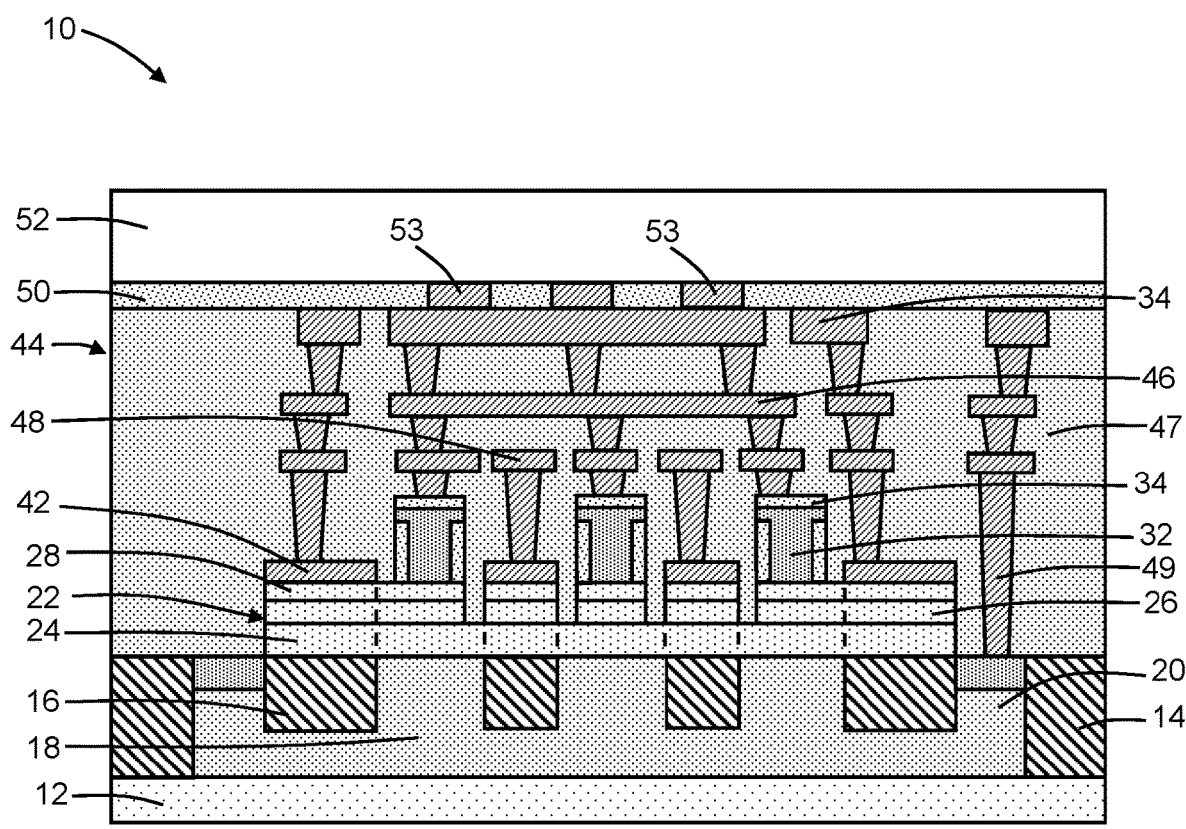
Figure 6A:
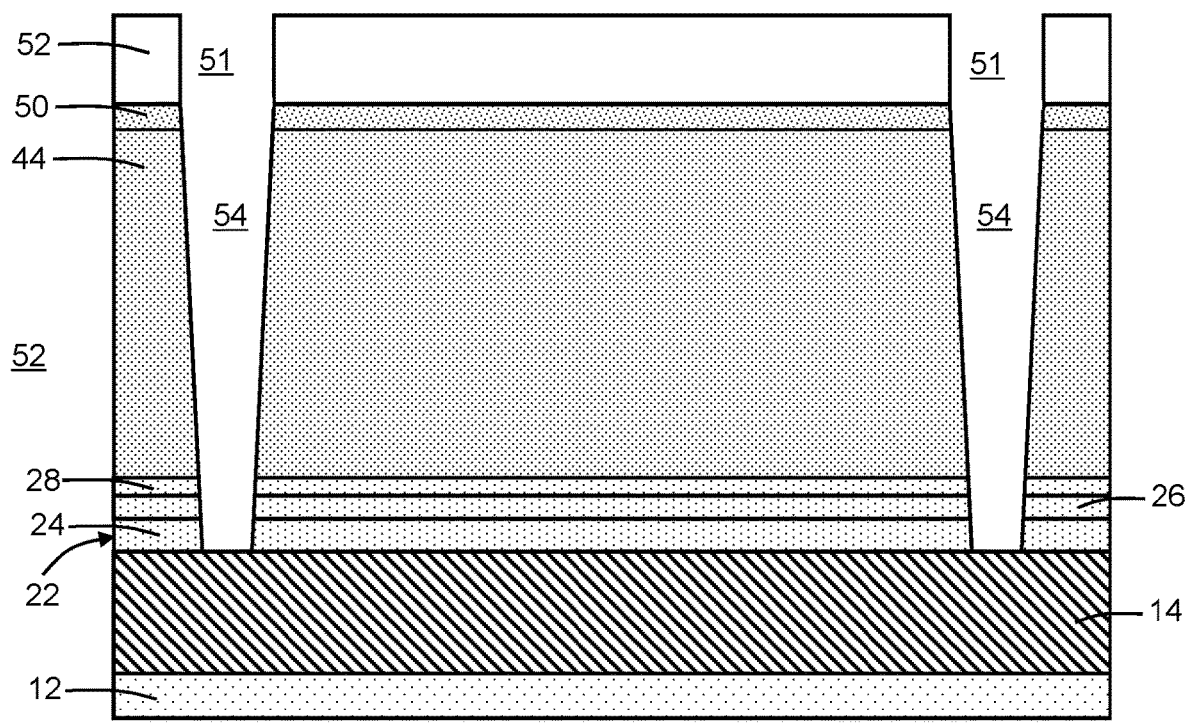

With reference to FIGS. 6, 6A in which like reference numerals refer to like features in FIGS. 5, 5A and at a subsequent fabrication stage of the processing method, an etch mask 52 is applied over the cap layer 50 and patterned by lithography to define openings 51 that expose respective portions of the interconnect structure arranged over each of the extension regions 30, 31 of the semiconductor layer 22. Openings 54 are formed at the locations of the openings 51 in the etch mask 52 and extend through the cap layer 50, the metallization levels 44, and the sublayers 24, 26, 28 of the semiconductor layer 22. The openings 54 may extend to the underlying trench isolation region 14. The openings 54 may be formed by one or more etching processes, such as reactive ion etching processes, that extend the openings 54 through the different layered materials and that may optionally control the wall angle. The metallization levels 44 and cap layer 50 are masked over the sections 23, 25 (FIGS. 1, 2) of the semiconductor layer 22 and are undisturbed during the etching process.

In an alternative embodiment, additional openings (not shown) may be distributed along the length of each of the extension regions 30, 31 at locations between the openings 54, which are localized near the opposite ends of each of the extension regions 30, 31. In an embodiment, the openings 54 may be consolidated into a single bar via opening defined in each of the extension regions 30, 31.

Figure 7:
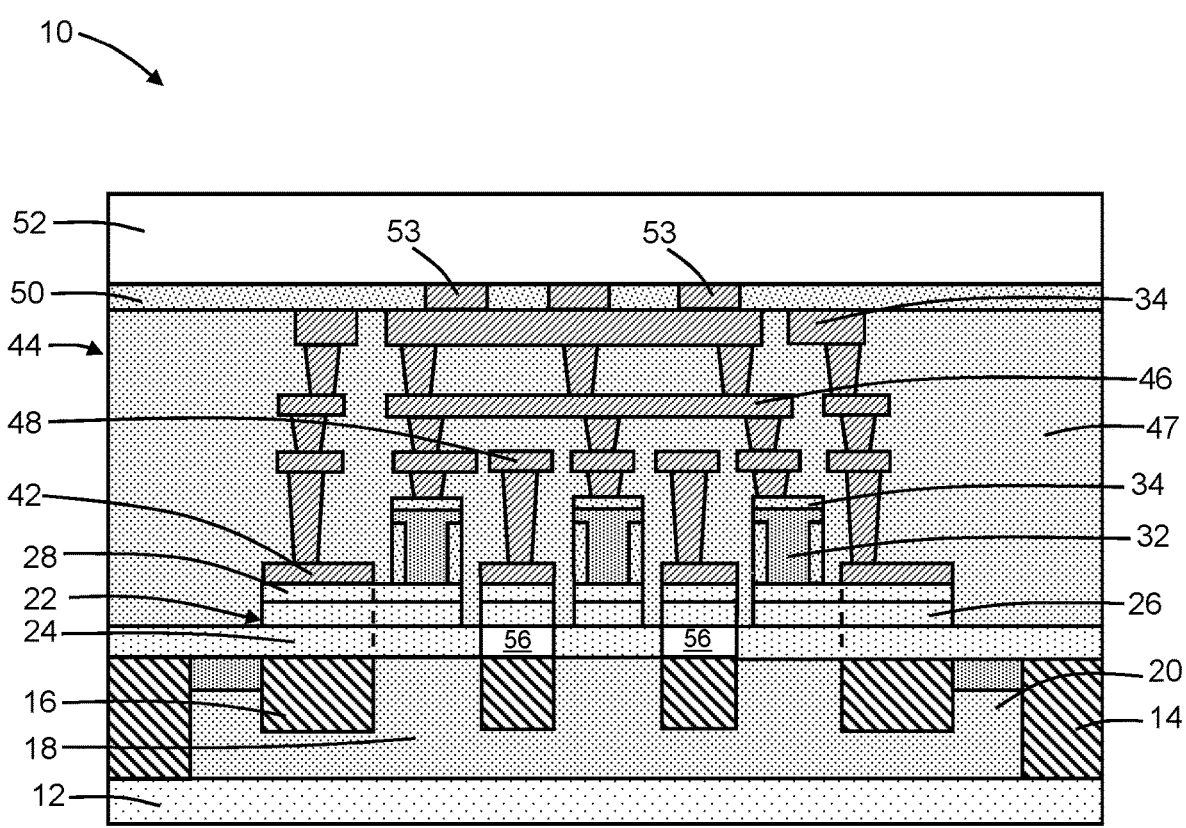
Figure 7A:
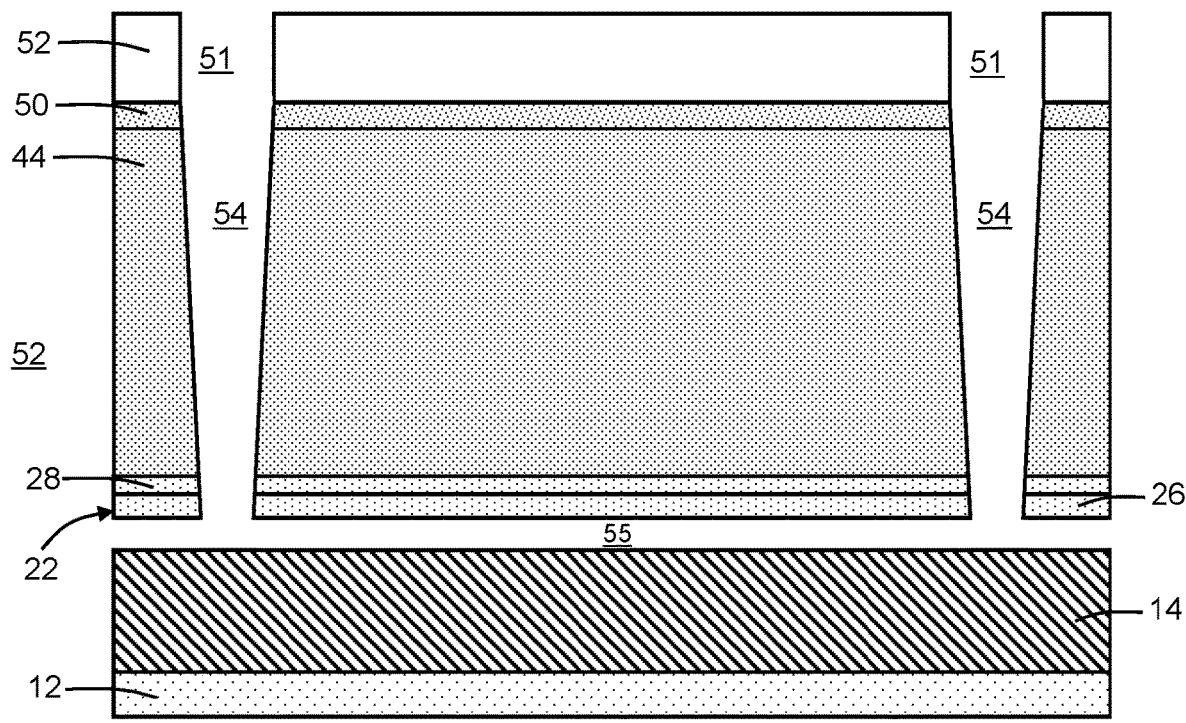

With reference to FIGS. 7, 7A in which like reference numerals refer to like features in FIGS. 6, 6A and at a subsequent fabrication stage of the processing method, cavities 55 are formed in the semiconductor layer 22 in the extension regions 30, 31 by directing a wet chemical etching into the openings 54. The etching process is continued to form cavities 56 into the sections 23 (FIGS. 1, 2) of the semiconductor layer 22 such that the cavities 55 in the opposite extension regions 30, 31 are connected and continuous. The cavities 55, 56 may be used in the structure 10, during its operation as a sensor, as fluid inlets and outlets for an electrolyte or solution containing charged ions or charged particles that is being circulated through the structure 10 using the openings 54 and cavities 56 for analysis of some property or characteristic. The cavities 56 are not formed in the outermost sections 23 of polycrystalline semiconductor material of the semiconductor layer 22, which are disconnected from the extension regions 30, 31 by the gaps. The cavities 55, 56 are unfilled and open, and the cavities 56 interconnect the cavities 55 in the extension region 30 with the cavities 55 in the extension region 31.

In an embodiment, the polycrystalline semiconductor material of the sublayer 24 of the semiconductor layer 22 may be removed with an etching process that includes a lateral etching component. In an embodiment, the etching process may be an isotropic wet chemical etching process. The etch chemistry of the isotropic etching process is selected to remove the polycrystalline semiconductor material of the sublayer 24 selective to the adjacent polycrystalline semiconductor materials in the sections of the sublayers 26, 28 and selective to the adjacent single-crystal semiconductor materials in the sections of the sublayers 24, 26, 28 of the semiconductor layer 22. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the height of the cavities 55, 56 may be equal to the thickness of the sublayer 24. The etch mask 52 may be removed subsequent to the performance of the etching process.

In an embodiment, the etching process etching and removing the polycrystalline semiconductor material of the sublayer 24 may rely on a wet chemical etchant with a basic pH that contains a substance, such as, for example, potassium hydroxide (KOH) or ammonium hydroxide ($NH_4OH$). The polycrystalline semiconductor material of the sublayer 26 of the semiconductor layer 22 is not etched by the etchant because of the compositional difference arising from its germanium content, and the polycrystalline semiconductor material of the sublayer 28 of the semiconductor layer 22 is not etched by the etchant because of its p-type doping. The single-crystal semiconductor material in the sublayers 24, 26, 28, of the semiconductor layer 22 is either not etched or only negligibly etched because of a lower etch rate for single-crystal semiconductor material in comparison with polycrystalline semiconductor material.

The structure 10 may be packaged using a cap wafer (not shown) with a redistribution layer and through-silicon vias that reroute connections with the pads 53 formed in the cap layer 50 and coupled with the metallization levels 44. The cap wafer may include passages that respectively are in fluid communication with the openings 54 for supplying the solution to the structure 10 and removing the solution from the structure 10. The packaged structure 10 may be used in various environments, such as part of an internet-of-things (IOT) chip.

Figure 7B:
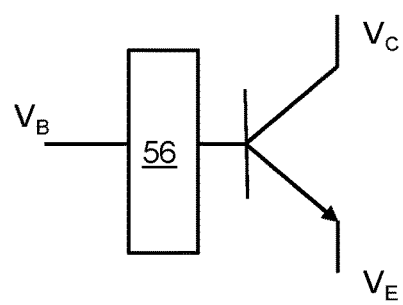
FIG. 7B is a schematic circuit diagram of the structure following fabrication.
Figure 7C:
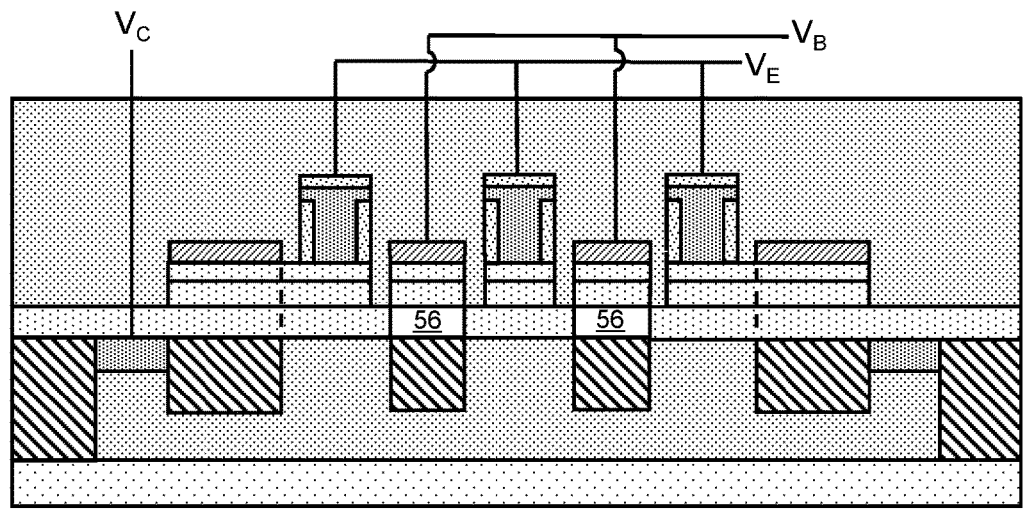
FIG. 7C is a diagrammatic view similar to FIG. 7 illustrating the connections of the circuit diagram of FIG. 7B in the structure.

In use and with reference to FIGS. 7B, 7C, a voltage $V_C$ may be applied to the contact regions 20, a voltage $V_E$ may be applied to the fingers 32, and a voltage $V_B$ (e.g., ground) may be applied to the single-crystal sections 25 of the semiconductor layer 22. The sensing current may be measured at the contact regions 20. The solution inside the cavities 56 is conductive due to, for example, ions in the solution, and provides a resistance in the connection to the base that has a resistance that may vary, for example, as a function of the ion concentration (or pH) of the solution inside the cavities 55. The sensing current varies as a function of the resistance.

In contrast to conventional sensors in which the cavities for solution circulation are formed in the back-end-of-line structure, the cavities 55, 56 are formed in the portion of the structure 10 that is fabricated by front-end-of-line processing. This relocation of the cavities 56 may reduce the impact on the footprint of the structure 10 within the chip. The sensor defined by the structure 10 may be used in a variety of practical sensing applications, such chemical, biochemical, and magnetic applications. The structure 10 may be fully integrated with other circuits, such as a power amplifier and/or a low-noise amplifier that may found in radiofrequency electronics and that may be formed using the heterojunction bipolar transistor 70 (FIG. 3B).

Figure 8:
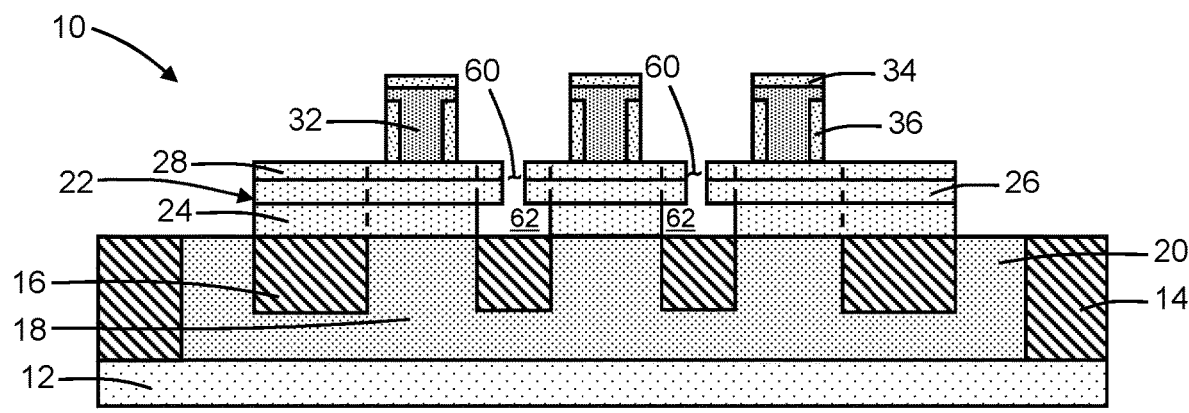
FIG. 8 is a cross-sectional view of a structure in accordance with alternative embodiments of the invention.

With reference to FIG. 8 in which like reference numerals refer to like features in FIG. 3 and in accordance with an alternative embodiment, openings 60 may be formed that extend through the polycrystalline semiconductor material of the sublayers 24, 26, 28 of the semiconductor layer 22 in the sections 23. Comparable openings are not formed in the peripheral outermost sections of the polycrystalline semiconductor material of the sublayers 24, 26, 28 of the semiconductor layer 22 in the sections 23, which are masked during the etching process. The openings 60 are arranged at spaced-apart locations along the length of the polycrystalline semiconductor material of the sublayers 24, 26, 28 of the semiconductor layer 22 in the sections 23 (FIGS. 1, 2). The openings 60 may be formed by lithography and etching processes in which the etching process is a reactive ion etching process that is anisotropic, and may therefore have vertical or substantially vertical sidewalls. Cavities 62 are defined by removing the polycrystalline semiconductor material of the sublayer 24 of the semiconductor layer 22 in the sections 23 selective to the polycrystalline semiconductor materials of the sublayers 26, 28 and the single-crystal semiconductor materials of the sublayers 24, 26, 28. The etching process forming the cavities 62 is similar to the etching process forming the cavities 56 and may similarly be isotropic. The openings 60 and cavities 62 are not formed in the outermost sections 23 of the polycrystalline semiconductor material of the semiconductor layer 22.

After forming the cavities 62, the cavities 56 are formed, as described above, in the extension regions 30, 31. The cavities 56 intersect and are continuous with the cavities 62. The cavities 56, 62 may be used in the structure 10, during its operation as a sensor, as fluid inlets and outlets for an electrolyte or solution being circulated through the structure 10 for analysis of some property or characteristic.

The cavities 62 may formed in structures constructed identical to the structure 10, at the conclusion of this fabrication stage, that are formed in other regions of the substrate 12 and used as heterojunction bipolar transistors in an electrical circuit. As mentioned above, these additional structures may be used to form a power amplifier and/or a low-noise amplifier as part of the same chip as the structure 10 providing a sensor. The introduction of the cavities 62 may be effective to reduce the collector-base capacitance of the heterojunction bipolar transistors.

Figure 9:
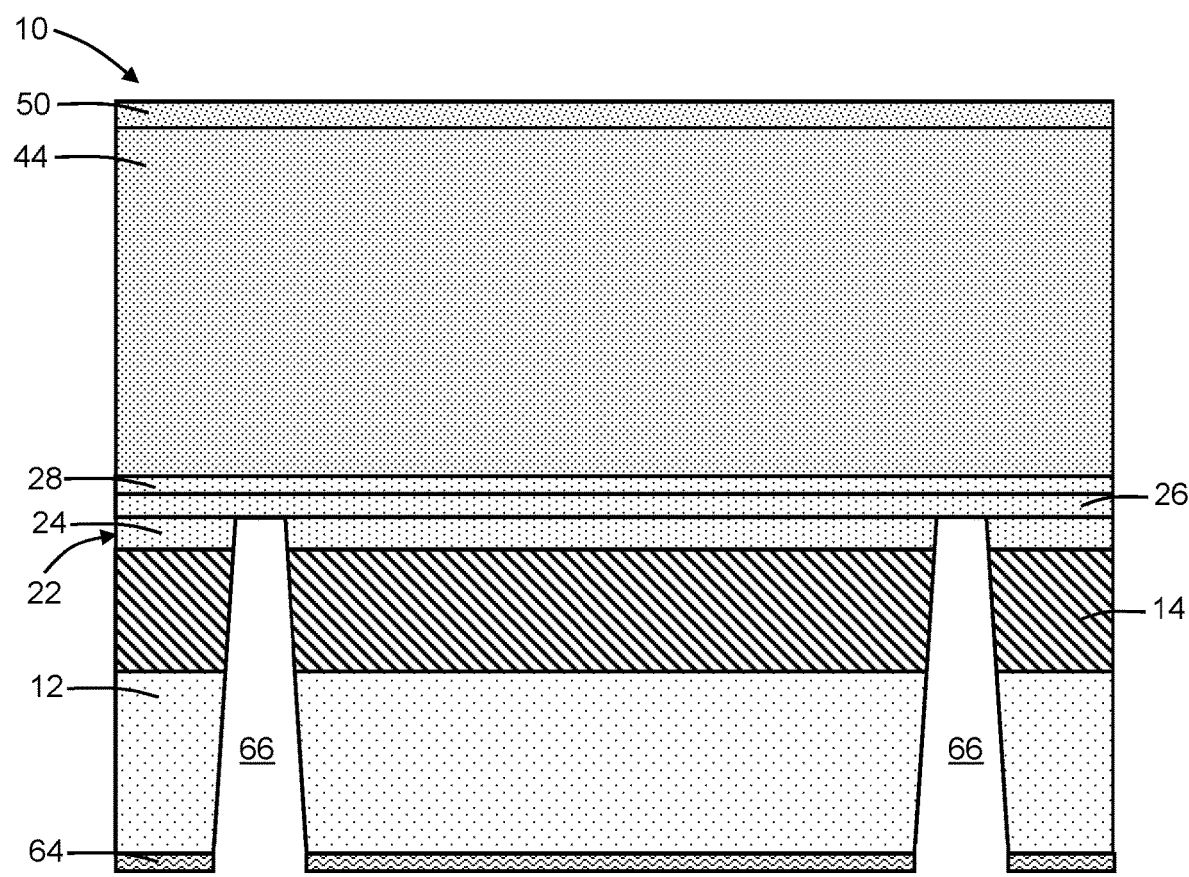
FIGS. 9-10 are cross-sectional views of a structure at successive fabrication stages of a processing method in accordance with alternative embodiments of the invention.

With reference to FIG. 9 in which like reference numerals refer to like features in FIG. 5A and in accordance with an alternative embodiment, a patterned polymer layer 64 may be formed at a back side 65 (i.e., a back surface opposite to the front surface 11) of the substrate 12 and openings 66 may be formed that extend through the substrate 12 to the semiconductor layer 22 in the extension regions 30, 31. In an embodiment, the openings 66 may terminate within the sublayer 24 of the semiconductor layer 22 and, preferably, may not penetrate into the sublayers 26, 28 such that the openings 66 only extend partially through the semiconductor layer 22. The openings 66 penetrating through the substrate 12 replace the openings 54 that are formed at the front side (i.e., front surface 11) of the substrate 12 and that extend through the metallization levels 44 to reach the semiconductor layer 22.

Figure 10:
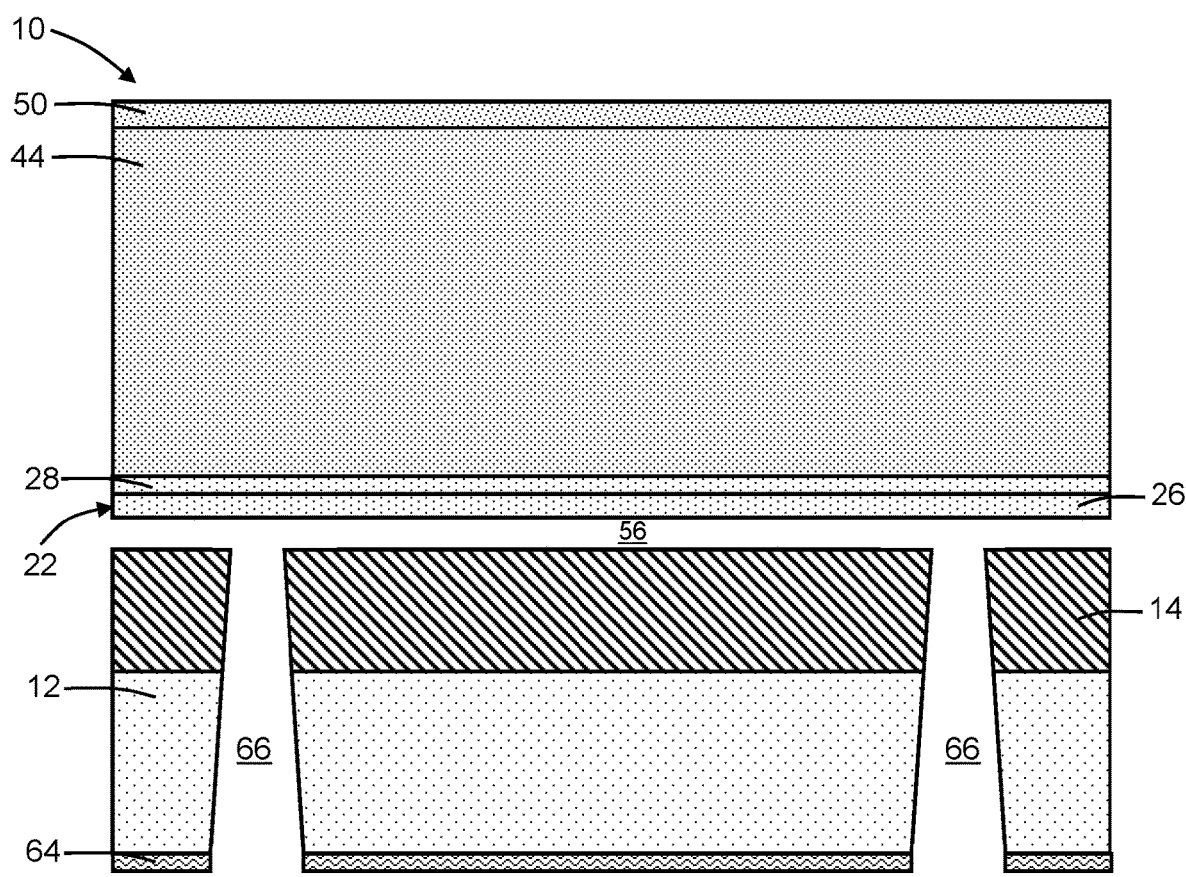

With reference to FIG. 10 in which like reference numerals refer to like features in FIG. 9 and at a subsequent fabrication stage of the processing method, the cavities 56 are formed in the extension regions 30, 31 of the semiconductor layer 22 by directing a wet chemical etching into the openings 66. The etching process may be continued to form the cavities 55 into the sections 23 (FIGS. 1, 2) of the semiconductor layer 22 such that the cavities 56 in the opposite extension regions 30, 31 are connected and continuous. In an alternative embodiment, the cavities 55 may be formed before the cavities 56 are formed as described in connection with FIG. 8.

The embodiments described herein may reduce the cost arising from the back-end-of-line placement of a solution-receiving cavity by instead placing the cavity in a front-end-of-line portion of the chip. The embodiments described herein may also reduce the complexity of non-standard packaging solutions and even the need for non-standard packaging solutions.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate;
    a semiconductor layer over the substrate, the semiconductor layer including a first plurality of sections comprised of a semiconductor material, a second plurality of sections comprised of the semiconductor material, and a first plurality of cavities, the first plurality of sections having an alternating arrangement with the second plurality of sections in a lateral direction;
    an interconnect structure over the semiconductor layer and the substrate, the interconnect structure including a plurality of metallization levels; and
    a first opening and a second opening extending in a vertical direction through the plurality of metallization levels of the interconnect structure to the semiconductor layer or through the substrate to the semiconductor layer, the first opening defining a fluid inlet coupled to the first plurality of cavities, and the second opening defining a fluid outlet coupled to the first plurality of cavities,
    wherein the semiconductor material of the first plurality of sections is polycrystalline, and the semiconductor material of the second plurality of sections is single-crystal.

2. The structure of claim 1 wherein the first opening and the second opening are arranged in the plurality of metallization levels of the interconnect structure, and the first opening and the second opening each extend through the plurality of metallization levels of the interconnect structure to the first plurality of cavities.

3. The structure of claim 2 further comprising:
a third opening extending in the vertical direction through the plurality of metallization levels of the interconnect structure to the semiconductor layer.

4. The structure of claim 1 wherein the first opening and the second opening are arranged in the substrate, and the first opening and the second opening each extend through from a backside of the substrate to the first plurality of cavities.

5. The structure of claim 4 further comprising:
a third opening extending in the vertical direction through the substrate to the semiconductor layer.

6. The structure of claim 1 wherein the first plurality of cavities have a first substantially parallel arrangement within the semiconductor layer, and the first plurality of sections have a second substantially parallel arrangement within the semiconductor layer.

7. The structure of claim 6 wherein each of the first plurality of cavities is respectively stacked with one of the first plurality of sections.

8. The structure of claim 1 wherein each of the first plurality of cavities is respectively stacked with one of the first plurality of sections.

9. The structure of claim 8 further comprising:
a plurality of trench isolation regions arranged in the substrate,
wherein the first plurality of cavities are respectively arranged in the vertical direction between the first plurality of sections and the plurality of trench isolation regions.

10. The structure of claim 1 wherein the plurality of metallization levels includes a first plurality of metallization features respectively connected with the first plurality of sections.

11. The structure of claim 10 further comprising:
a plurality of fingers comprised of a doped semiconductor material, each of the plurality of fingers arranged over one of the second plurality of sections of the semiconductor layer; and
a contact region in the substrate.

12. The structure of claim 1 further comprising:
a heterojunction bipolar transistor monolithicially arranged on the substrate,
wherein the heterojunction bipolar transistor includes a base layer that is a section of the semiconductor layer.

13. The structure of claim 1 wherein the semiconductor layer includes a first extension region and a second extension region each comprised of the semiconductor material that is polycrystalline, the first plurality of sections of the semiconductor layer are arranged in the lateral direction between the first extension region and the second extension region, the first extension region includes one or more second cavities that are couple the first opening with the first plurality of cavities, and the second extension region includes one or more third cavities that couple the second opening with the first plurality of cavities.

14. The structure of claim 1 wherein the semiconductor layer includes a plurality of notches extending partially through the second plurality of sections of the semiconductor layer and along a length of the second plurality of sections of the semiconductor layer, the plurality of notches are filled by a dielectric material, and each of the plurality of notches is arranged fully between one of the first plurality of sections and one of the second plurality of sections.

15. A method comprising:
forming a semiconductor layer over a substrate, wherein the semiconductor layer includes a first plurality of sections comprised of a semiconductor material and a second plurality of sections comprised of the semiconductor material, wherein the first plurality of sections have an alternating arrangement with the second plurality of sections in a lateral direction;
forming an interconnect structure over the semiconductor layer and the substrate, the interconnect structure including a plurality of metallization levels;
forming a first opening and a second opening extending in a vertical direction through the plurality of metallization levels of the interconnect structure or through the substrate to the semiconductor layer; and
partially removing the first plurality of sections with an etching process to define a plurality of cavities in the semiconductor layer,
wherein the first opening defines a fluid inlet coupled to the plurality of cavities, the second opening defines a fluid outlet coupled to the plurality of cavities, the semiconductor material of the first plurality of sections is polycrystalline, and the semiconductor material of the second plurality of sections is single-crystal.

16. The method of claim 15 wherein the plurality of cavities and the second plurality of sections of the semiconductor layer comprise a sensor, and further comprising:
processing the substrate to form a heterojunction bipolar transistor in parallel with the sensor,
wherein the heterojunction bipolar transistor includes a base layer that is formed over the substrate concurrently with the formation of the semiconductor layer.

17. The method of claim 15 wherein the first opening and the second opening are arranged in the plurality of metallization levels of the interconnect structure, and further comprising:
etching the first opening and the second opening fully through the plurality of metallization levels of the interconnect structure to the plurality of cavities.

18. The method of claim 15 wherein the first opening and the second opening are arranged in the substrate, and further comprising:
etching the first opening and the second opening from a backside of the substrate fully through the substrate to the plurality of cavities.

19. The method of claim 15 wherein the first plurality of sections are partially removed with the etching process before the first opening and the second opening are formed.

20. The method of claim 15 wherein the first plurality of sections are partially removed by directing an etchant through the first opening and the second opening to the semiconductor layer.

* * * * *